(12) United States Patent  
Suda et al.

(10) Patent No.: US 7,382,117 B2  
(45) Date of Patent: Jun. 3, 2008

(54) DELAY CIRCUIT AND TEST APPARATUS USING DELAY ELEMENT AND BUFFER

(75) Inventors: Masakatsu Suda, Tokyo (JP); Shuusuke Kantake, Tokyo (JP)

(73) Assignee: Advantest Corporation, Tokyo (JP)

( * ) Notice: Subject to any disclaimer, the term of this patent is extended or adjusted under 35 U.S.C. 154(b) by 302 days.

(21) Appl. No.: 11/172,450

(22) Filed: Jun. 29, 2005

(65) Prior Publication Data

US 2006/0284662 A1    Dec. 21, 2006

(30) Foreign Application Priority Data

Jun. 17, 2005   (JP)  ............................. 2005-177851

(51) Int. Cl.  
*G01R 31/02* (2006.01)

(52) U.S. Cl. .................... 324/158.1; 324/765

(58) Field of Classification Search ............. 324/158.1, 324/760–769; 327/100, 107, 291–295, 158–161; 714/36, 724

See application file for complete search history.

(56) References Cited

U.S. PATENT DOCUMENTS

| | | | |
|---|---|---|---|
| 4,631,724 A * | 12/1986 | Shimizu | ...................... 714/718 |
| 5,081,380 A | 1/1992 | Chen | |
| 5,097,208 A * | 3/1992 | Chiang | ........................ 324/537 |
| 6,300,807 B1 * | 10/2001 | Miyazaki et al. | ........... 327/158 |
| 6,587,983 B1 * | 7/2003 | Nakayama | .................. 714/736 |
| 6,995,554 B2 * | 2/2006 | Loke et al. | .............. 324/76.54 |

FOREIGN PATENT DOCUMENTS

| | | |
|---|---|---|
| JP | 3-171812 | 7/1991 |
| JP | 5-268009 | 10/1993 |
| JP | 2003-17988 | 1/2003 |

OTHER PUBLICATIONS

International Search Report issued in International Application No. PCT/JP2006/311606 mailed on Jul. 4, 2006, 3 pages.

* cited by examiner

*Primary Examiner*—Vinh P Nguyen  
(74) *Attorney, Agent, or Firm*—Osha • Liang LLP

(57) ABSTRACT

There is provided a delay circuit that delays an input signal to output the delayed signal. The delay circuit includes a first delay element operable to receive the input signal and delay the input signal to output the delayed signal, a buffer operable to receive the delay signal output from the first delay element and correct a dullness of a waveform of the delay signal generated from the first delay element to output the corrected signal, and a second delay element operable to receive the delay signal output from the buffer and delay the delay signal to output the delayed signal.

9 Claims, 11 Drawing Sheets

DELAY CIRCUIT AND TEST APPARATUS USING DELAY ELEMENT AND BUFFER

CROSS REFERENCE TO RELATED APPLICATION

This patent application claims priority from a Japanese Patent Application No. 2005-177851 filed on Jun. 17, 2005, the contents of which are incorporated herein by reference.

BACKGROUND OF THE INVENTION

1. Field of the Invention

The present invention relates to a delay circuit that delays an input signal to output the signal and a test apparatus that tests a device under test. More particularly, the present invention relates to a delay circuit in which a plurality of delay elements is serially connected to one another.

2. Description of Related Art

Conventionally, a circuit that dulls a waveform of an input signal to delay the input signal by a predetermined delay amount has been known as a delay circuit for delaying the input signal. For example, there has been known a delay circuit that inputs an input signal into an inverter, charges and discharges load capacitance of the inverter, and outputs a voltage waveform in the load capacitance. The delay circuit adjusts rising time and falling time of the voltage waveform in the load capacitance and controls a delay amount to be given to the input signal by controlling a power source current of the inverter to control a charging and discharging current of the load capacitance.

However, when a conventional delay circuit has a large delay amount, a pulse from the delay circuit may become unsteady. For example, when the delay circuit charging and discharging the load capacitance has a large delay amount, a current value charging the load capacitance is reduced. The delay circuit charges the load capacitance for a period for which a pulse of the input signal shows an H-logic. However, since the charging current is small, the voltage of the load capacitance may not stand at a predetermined reference value or the time for which the voltage of the load capacitance stands at a value more than the reference value may not acquire sufficiently.

For such a problem, it is considered that a plurality of delay circuits is serially connected to one another and each delay circuit has a delay amount within a range in which a pulse is stable. However, in such a configuration, a waveform output from each delay circuit gets dull. Each delay circuit turns on/off its CMOS transistor according to the voltage of the input signal and charges and discharges the load capacitance by a power source current according to a delay setting. However, when the waveform of the signal received from the delay circuit in a previous stage gets dull, the timing in which the voltage enough to flow the power source current according to the delay setting is applied to the CMOS transistor gets late. Thus, the delay time in the delay circuit has an error with respect to the delay setting. Therefore, linearity for delay in the delay circuit has deteriorated.

SUMMARY OF THE INVENTION

Therefore, it is an object of the present invention to provide a delay circuit and a test apparatus that can solve the foregoing problems. The above and other objects can be achieved by combinations described in the independent claims. The dependent claims define further advantageous and exemplary combinations of the present invention.

To solve this problem, according to the first aspect of the present invention, there is provided a delay circuit that delays an input signal to output the delayed signal. The delay circuit includes: a first delay element operable to receive the input signal and delay the input signal to output the delayed signal; a buffer operable to receive the delay signal output from the first delay element and correct a dullness of a waveform of the delay signal generated from the first delay element to output the corrected signal; and a second delay element operable to receive the delay signal output from the buffer and delay the delay signal to output the delayed signal.

According to the second aspect of the present invention, there is provided a delay circuit that delays an input signal to output the delayed signal. The delay circuit includes: a first delay block operable to receive the input signal and delay the input signal to output the delayed signal; a second delay block operable to delay the delay signal output from the first delay block to output the delayed signal: and a second delay control block operable to control a delay amount of the second delay block, in which the first delay block and the second delay block respectively includes: a first delay element that receives the input signal and delays the input signal to output the delayed signal; a buffer that receives the delay signal output from the first delay element and corrects a dullness of a waveform of the delay signal generated from the first delay element to output the corrected signal; and a second delay element that receives the delay signal output from the buffer and delays the delay signal to output the delayed signal, the second delay control block includes: a flip-flop that divides a signal to be input into the first delay block to receive the divided signal and acquires a delay setting data to control the delay amount according to the signal to be input into the first delay block; and a delay controlling unit that controls the delay amount of the second delay block based on the delay setting data acquired by the flip-flop.

According to the third aspect of the present invention, there is provided a test apparatus that tests a device under test. The test apparatus includes: a pattern generator operable to generate a test pattern testing the device under test; a waveform shaper operable to shape a test signal to be supplied to the device under test based on the test pattern and supply the shaped signal to the device under test; and a timing generator operable to generate a timing signal controlling the timing in which the waveform shaper supplies the test signal to the device under test, in which the timing generator includes: a first delay element that receives a reference signal and delays the reference signal to output the delayed signal; a buffer that receives the delay signal output from the first delay element and corrects a dullness of a waveform of the delay signal generated from the first delay element to output the corrected signal; and a second delay element that receives the delay signal output from the buffer and delays the delay signal to output the timing signal.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
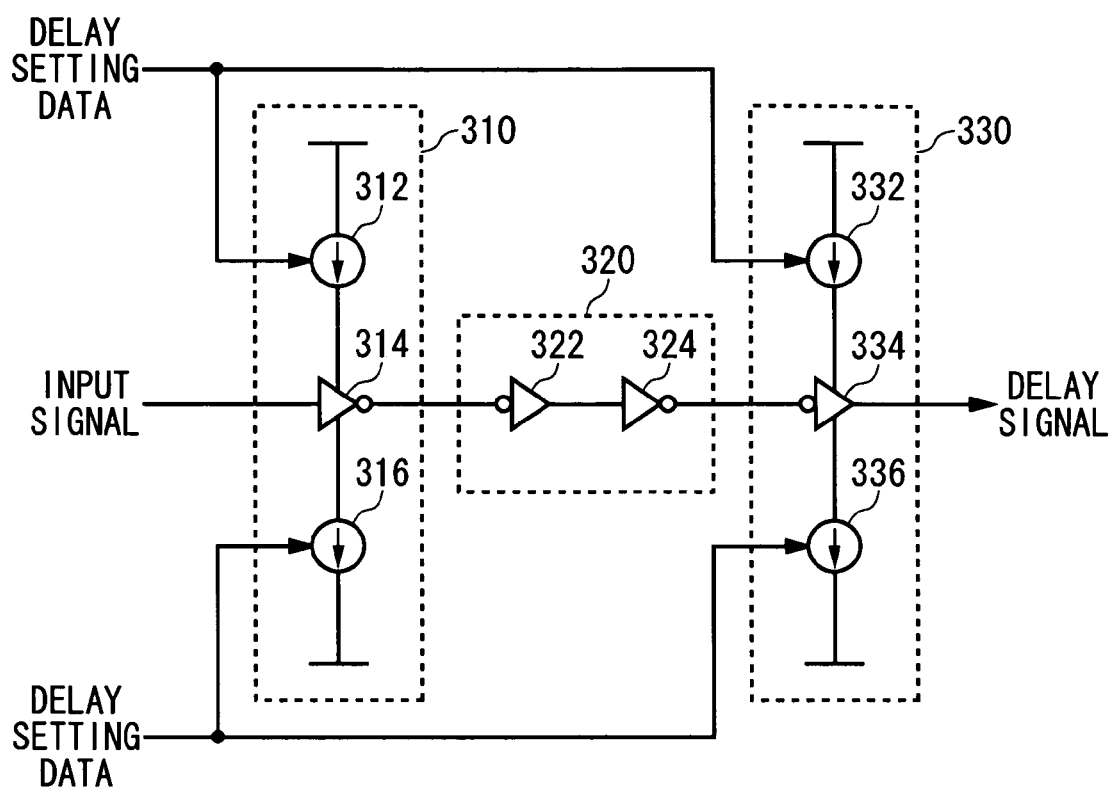
FIG. 1 is a view exemplary showing a configuration of a delay circuit according to an embodiment of the present invention.

FIG. 1 is a view exemplary showing a configuration of a delay circuit 300 according to an embodiment of the present invention. The delay circuit 300 is a circuit that delays an input signal to output the delayed signal, and includes a first delay element 310, a second delay element 330, and a buffer 320.

The first delay element 310 receives an input signal and delays the input signal to output the delayed signal. Moreover, the first delay element 310 dulls a waveform of the input signal according to a given delay setting data in order to delay the input signal. The first delay element 310 in this example has a source side current source 312, a sink side current source 316, and a first inverter 314.

The first inverter 314 receives the input signal, and outputs the delay signal made by delaying and inverting the input signal. The source side current source 312 and the sink side current source 316 supply a power source current according to the given delay setting data to the first inverter 314, and control a delay amount of the first inverter 314.

For example, the first inverter 314 has a CMOS transistor that receives the input signal via its gate terminal, and charge and discharges load capacitance according to the on/off of the CMOS transistor to output a voltage waveform of the load capacitance as a voltage waveform of the delay signal. The source side current source 312 supplies a power source current charging the load capacitance to the first inverter 314, and the sink side current source 316 draws the power source current discharging the load capacitance from the first inverter 314.

For example, when the first delay element 310 has a large delay, the power source current supplied from the source side current source 312 to the first inverter 314 gets smaller, and thus a rising edge of a waveform of the delay signal output from the first inverter 314 gets dull. By such a control, a desired delay is caused by the first delay element 310.

The buffer 320 receives the delay signal output from the first delay element 310, and corrects a dullness of the waveform of the delay signal generated from the first delay element to output the corrected signal. Here, it is desirable that the buffer 320 corrects the dullness of the waveform of the delay signal in a state that the delay generated by the first delay element 310 is held.

For example, a delay amount of the delay signal to the input signal is given by the difference between the timing in which a voltage value of the rising edge of the input signal exceeds a predetermined threshold voltages and the timing in which a voltage value of the rising edge of the delay signal exceeds the predetermined threshold voltage. At this time, the buffer 320 corrects the received delay signal to change it into a signal having rising time substantially approximate to zero in the timing in which the voltage value of the rising edge of the delay signal exceeds the predetermined threshold voltage. Moreover, the buffer 320 may correct the received delay signal to change it into a signal having the substantially same rising time as that of the input signal in the timing in which the voltage value of the rising edge of the delay signal exceeds the predetermined threshold voltage.

In this example, the buffer 320 has two inverters 322 and 324 connected in series with each other. The buffer 320 outputs the delay signal received from the first delay element 310 to the second delay element 330 through the two inverters 322 and 324. Moreover, the buffer 320 may have an even number of inverters more than two connected in series with one another.

The second delay element 330 receives the delay signal output from the buffer 320, and delays the delay signal to output the delayed signal. Moreover, the second delay element 330 dulls a waveform of the input signal according to a given delay setting data to delay the input signal, similarly to the first delay element 310. Moreover, the second delay element 330 may have the same configuration as that of the first delay element 310. In this example, the second delay element 330 has a source side current source 332, a sink side current source 336, and a second inverter 334. The source side current source 332, the sink side current source 336, and the second inverter 334 included in the second delay element 330 may have the same characteristics and functions as those of the source side current source 312, the sink side current source 316, and the first inverter 314 included in the first delay element 310.

By such a configuration, it is possible to correct a dullness of the waveform caused by the first delay element 310 to make a delay in the second delay element 330 with high precision. Moreover, the delay circuit 300 may identically control the delay amounts of the first delay element 310 and the second delay element 330. In this example, the first delay element 310 and the second delay element 330 are supplied with the same delay setting data, and each current source generates a power source current according to the delay setting data. In this case, the first delay element 310 and the second delay element 330 respectively delay the received signal with a delay amount made by dividing the delay amount to be caused by the delay circuit 300 by about two.

Moreover, a desired delay can be made in the delay circuit 300 by controlling the delay setting data to be supplied to the delay circuit 300. In this case, the first delay element 310 and the second delay element 330 function as variable delay circuits that respectively have a delay amount according to the delay setting data set previously. Moreover, the buffer 320 has a generally constant delay amount regardless of the delay setting data. At this time, an error by the delay of the buffer 320 may be generated between a delay amount expected for the delay setting data and a delay amount caused by the delay circuit 300. However, since the delay amount by the buffer 320 is constant regardless of the delay setting data, the linearity of delay caused by the delay circuit 300 does not deteriorate. For this reason, it is possible to control the delay by the delay circuit 300 with the delay setting data with high precision, e.g., by previously measuring a delay amount of the buffer 320.

Figure 2A:
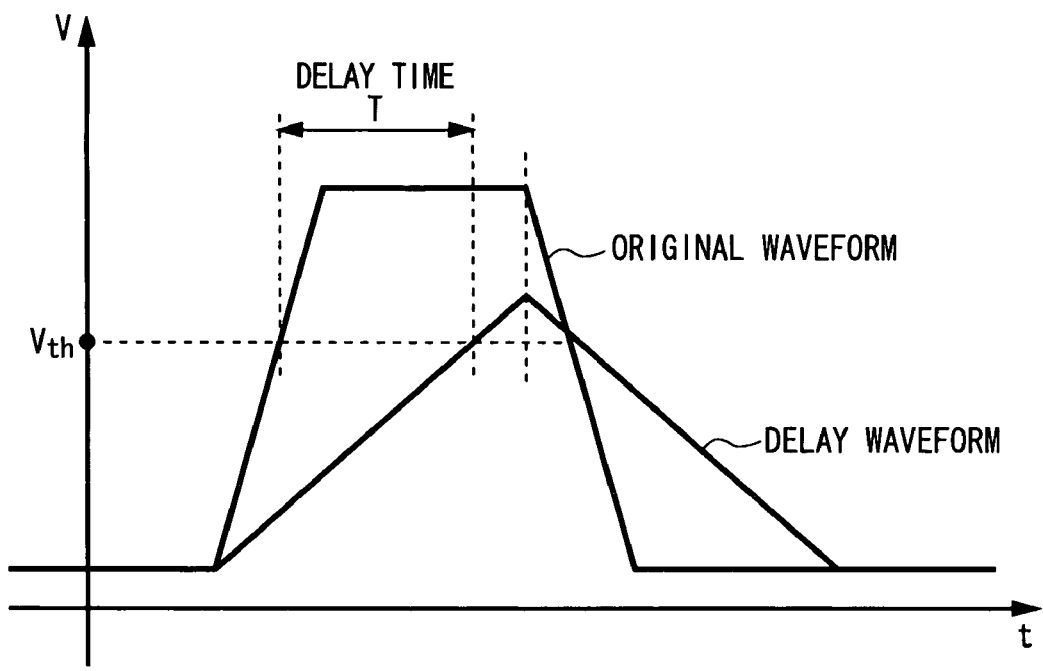
FIG. 2A shows waveforms of an input signal and a delay signal in a conventional delay circuit.
Figure 2B:
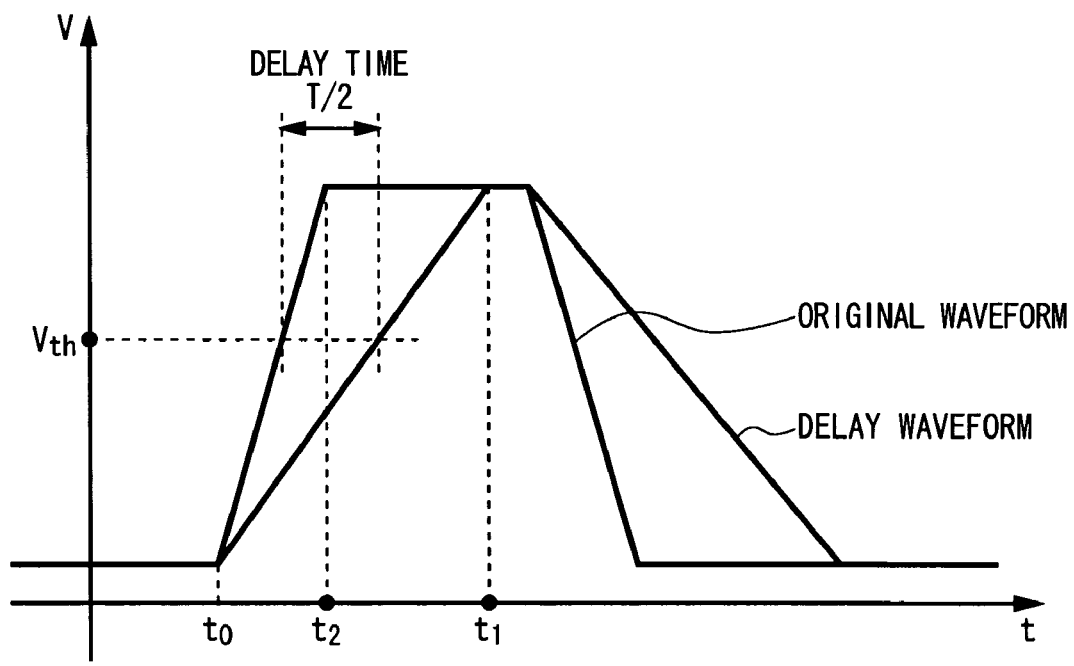
FIG. 2B shows a waveform in a first delay element.

FIGS. 2A and 2B are views exemplary showing the waveforms of the input signal and the delay signal. FIG. 2A shows the waveforms in the conventional delay circuit, and FIG. 2B shows the waveforms in the first delay element 310. As shown in FIG. 2A, when a large delay is generated by a delay element of one stage, it is necessary to increase a dullness of a rising edge and a falling edge of the delay waveform. Therefore, since the timing in which the voltage of the delay signal exceeds a predetermined threshold voltage Vth gets late, settling time of the delay signal may not sufficiently be secured.

Meanwhile, the first delay element 310 in the delay circuit 300 generates a delay made by dividing the delay amount T to be caused by the delay circuit 300 by two. Thus, a time interval between a starting point of the rising edge of the delay signal and the timing in which the voltage of the delay signal exceeds the predetermined threshold voltage Vth is about one-half compared to the case shown in FIG. 2A. Therefore, the delay signal output from the first delay element 310 can secure the settling time.

Moreover, the delay circuit 300 including two delay elements is shown in FIG. 1. However, although the delay amount of the delay circuit 300 is divided into two, when the settling time of the delay signal in each delay element cannot be secured, the delay circuit 300 may further include a delay element having the same configuration as that of the first delay element 310 or the second delay element 330 in subordination to the second delay element 330. When a necessary delay amount is generated in a manner that each delay element generates a delay amount made by dividing the necessary delay amount by the number of delay elements, the delay circuit 300 may have a plurality of delay elements so that a delay amount of each delay element is within a range in which a pulse of the delay signal is settled.

Figure 3A:
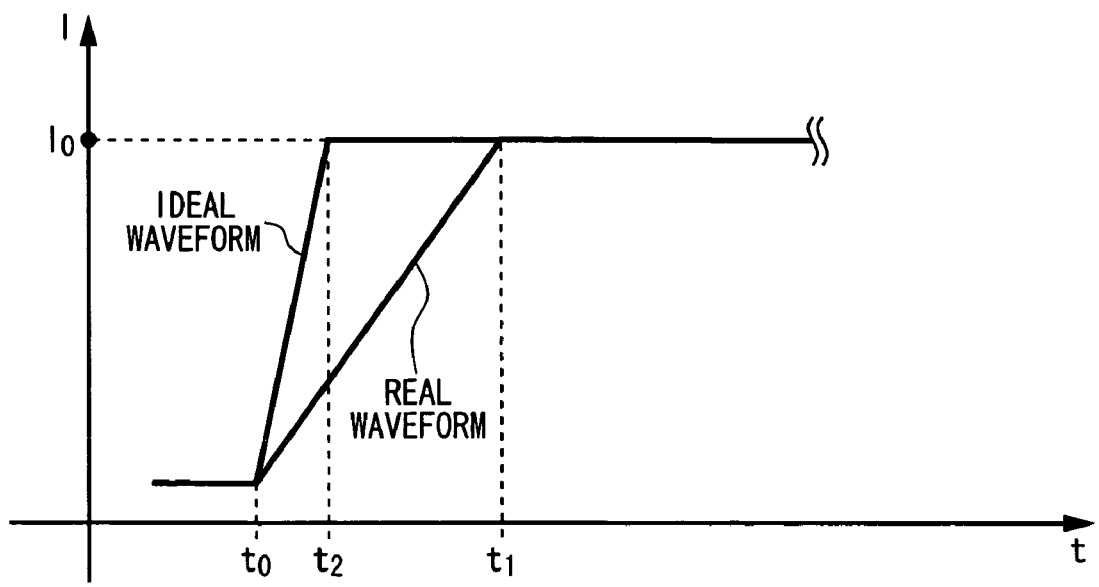
FIG. 3A is a view exemplary showing a current waveform charging load capacitance in a second delay element.
Figure 3B:
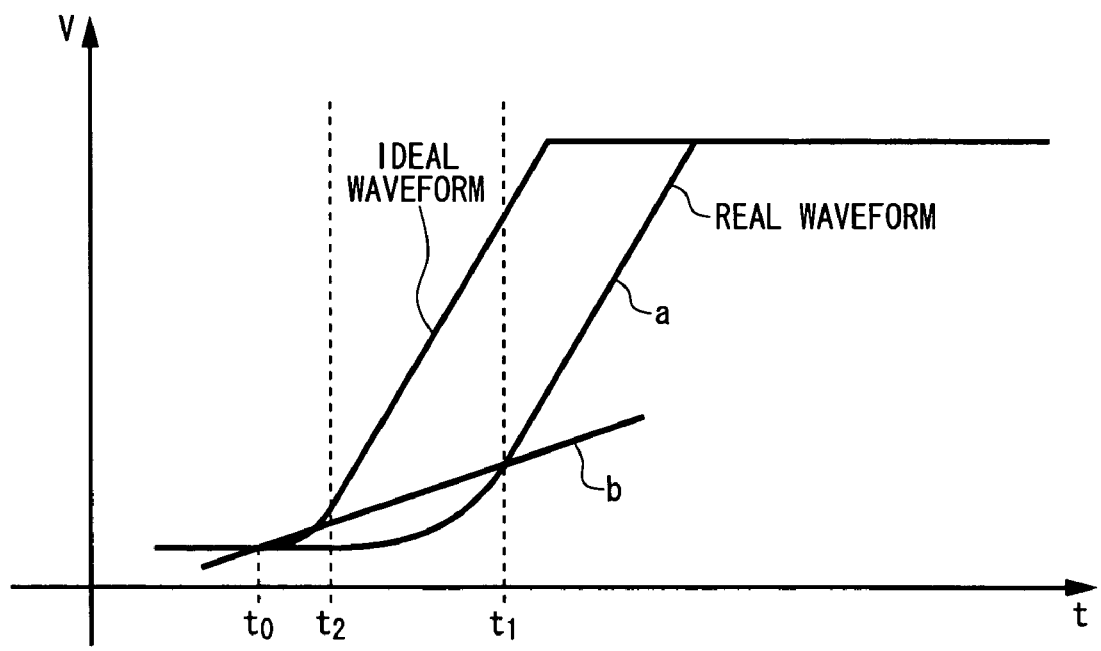
FIG. 3B is a view exemplary showing a voltage waveform of the load capacitance.

FIGS. 3A and 3B are views exemplary showing the waveforms of the signals related to the load capacitance of the second delay element 330. FIG. 3A is a view exemplary showing a current waveform charging the load capacitance in the second delay element 330, and FIG. 3B is a view exemplary showing a voltage waveform related to the load capacitance. The source side current source 332 of the second delay element 330 generates a power source current $I_0$ according to the delay setting data. However, the time until a charging current to be supplied to the load capacitance reaches $I_0$ gets late due to a characteristic of the CMOS transistor included in the second inverter 334 and the voltage waveform of the delay signal to be input.

For example, when a voltage Vg is applied to a gate terminal of the CMOS transistor, it will be described about when the CMOS transistor outputs the charging current $I_0$. At this time, assuming that the time until the voltage value of the rising edge of the delay signal to be input into the gate terminal of the CMOS transistor reaches Vg can approximate zero, the time (t2-t0) until the charging current reaches $I_0$ can approximate zero as shown by an ideal waveform of FIG. 3A. At this time, the voltage value of the voltage waveform related to the load capacitance increases with a generally constant inclination as shown by an ideal waveform of FIG. 3B. In this case, the linearity of delay in the second delay element 330 does not deteriorate.

However, as shown by the delay waveform of FIG. 2B, when the rising edge of the delay signal to be input into the gate terminal of the CMOS transistor gets dull, it requires time until the gate voltage of the CMOS transistor reaches Vg. In this case, as shown in a real waveform of FIG. 3A, the time (t1-t0) until the charging current of the load capacitance reaches $I_0$ gets late. At this time, the voltage waveform in the load capacitance has a region (t0 to t1) increasing nonlinearly and a region (from t1) increasing linearly, as shown in a real waveform of FIG. 3B. Therefore, the linearity of delay in the second delay element 330 deteriorates.

According to the delay circuit 300 shown in FIG. 1, the buffer 320 is provided in a previous stage of the second delay element 330, and corrects a dullness of the waveform of the delay signal to be input into the second delay element 330 in a state that the delay caused by the first delay element 310 is held. Thus, it is possible to reduce the degradation of linearity of the delay explained in FIG. 3. Therefore, it is possible to generate a delay with high precision.

Figure 4:
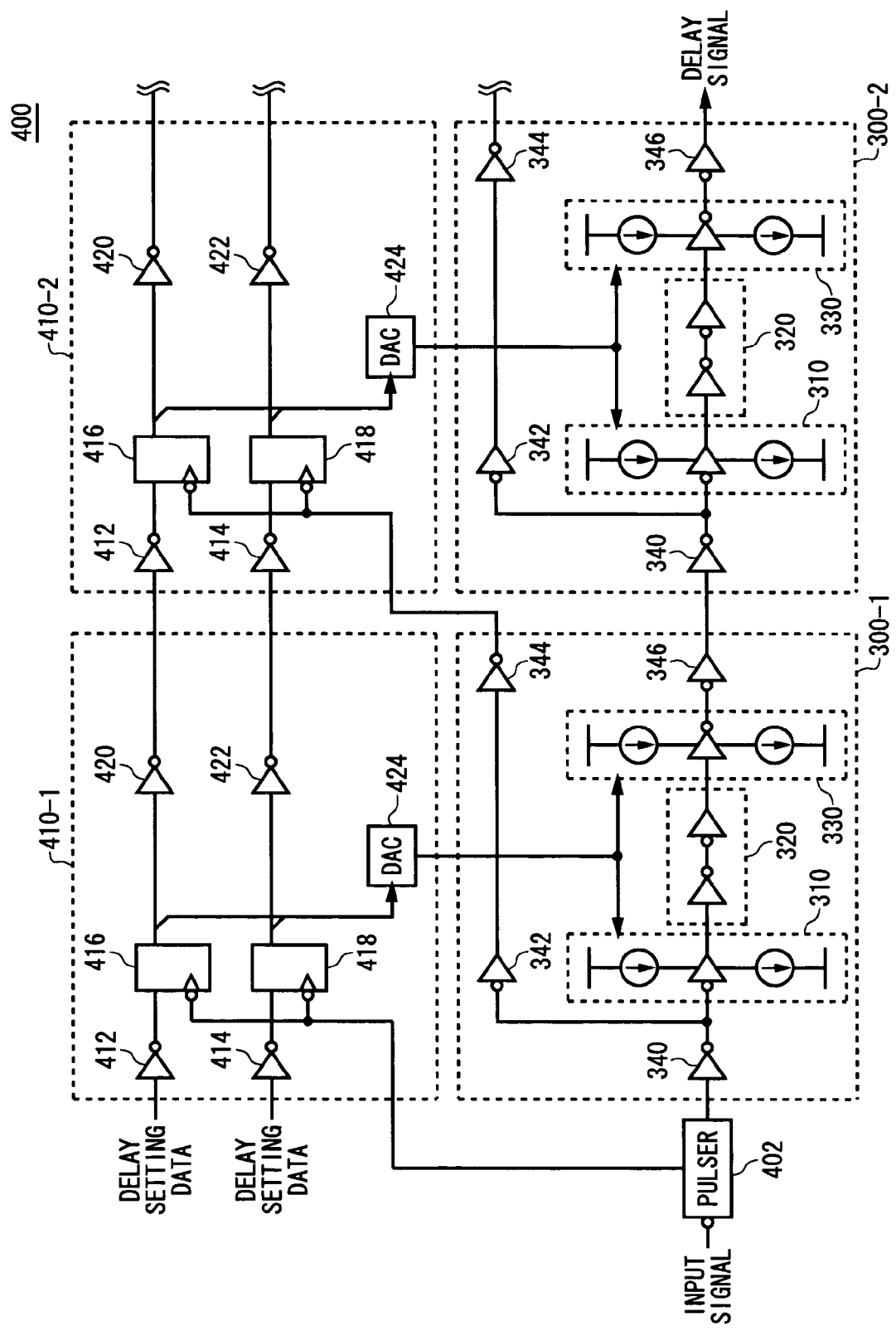
FIG. 4 is a view exemplary showing a configuration of a delay circuit according to an embodiment of the present invention.

FIG. 4 is a view exemplary showing a configuration of a delay circuit 400 according to an embodiment of the present invention. The delay circuit 400 in this example is a circuit that delays an input signal to output the delayed signal, and includes a pulser 402, a first delay block 300-1, a second delay block 300-2, a first delay control block 410-1, and a second delay control block 410-2. The pulser 402 receives the input signal, and shapes a pulse in the input signal to output the shaped signal.

The first delay block 300-1 receives the input signal from the pulser 402, and delays the input signal to output the delayed signal. Moreover, the second delay block 300-2 receives the delay signal output from the first delay block 300-1, and delays the delay signal to output the delayed signal.

The first delay block 300-1 and the second delay block 300-2 further include inverters 340 to 346 respectively in addition to a configuration of the delay circuit 300 described in reference to FIG. 1. The inverter 340 and the inverter 346 correct a dullness of a waveform of a delay signal that is transmitted between the delay blocks, similarly to an inverter included in the buffer 320. In this example, the inverter 340 is provided in a previous stage of the first delay element 310, and the inverter 346 is provided in a subsequent stage of the second delay element 330. The inverter 346 in each delay block and the inverter 340 in the delay block in the next stage perform the same function as that of the buffer 320. The inverter 340 and the inverter 346 may have the same function and configuration as those of the inverters 322 and 324 explained in FIG. 1. Moreover, in another example, the inverter 340 and the inverter 346 may be provided in the previous stage of the first delay element 310 together, or may be provided in the subsequent stage of the second delay element 330 together.

In FIG. 4, it will be described about when two stages of delay blocks are connected to each other. However, it is also possible to connect more delay blocks. By such a configuration, in a configuration that a plurality of delay blocks is subordinately connected to one another, it is possible to connect a dullness of a signal that is transmitted between the delay elements and to delay an input signal using the multistage delay elements. Thus, it is possible to reduce a delay amount to be generated by one delay element. Although it is necessary to generate larger delay amount, it is possible to easily settle a waveform in each delay element. Moreover, since the delay blocks included in the delay circuit 400 have the same configuration, the number of delay block can easily be adjusted.

Moreover, the inverter 342 and the inverter 344 of each delay block input the signal to be input into the first delay element 310 of each delay block into the delay control block 410 corresponding to the delay block in the next stage. Each delay control block 410 acquires delay control data using the signal received from the delay block in the previous stage as a trigger signal, and controls a delay amount in the corresponding delay block. Moreover, the delay control block 410 in the previous stage acquires the delay control data according to the trigger signal supplied from the pulser 402, and controls a delay amount in the first delay block 300-1.

By such a configuration, it is possible to control a delay amount in each delay block in real time. Therefore, it is possible to provide a variety of delays with respect to an input signal. Moreover, before inputting the input signal into the first delay block 300-1, it is preferable that the pulser 402 outputs the trigger signal so that the first delay control block can set the delay amount.

The delay control blocks 410 are respectively provided corresponding to the delay blocks. The delay circuit 400 in FIG. 4 includes two delay blocks and two delay control blocks 410. However, in another example, the delay circuit 400 may include multiple delay blocks and delay control blocks 410 having the same number. Each delay control block 410 has a plurality of inverters 412, 414, 420, and 422, a plurality of flip-flops 416 and 418, and a delay controlling unit 424.

The inverter 412 and the inverter 414 receive delay setting data. For example, the inverter 412 receives a predetermined high-order bit among the delay setting data, and the inverter 414 receives the other low-order bit among the delay setting data. The flip-flop 416 and the flip-flop 418 acquire and hold the delay setting data output from the inverter 412 and the inverter 414 according to the given trigger signal.

The delay controlling unit 424 controls a delay amount in the corresponding delay block based on the delay setting data held in the flip-flop 416 and the flip-flop 418. In this example, the delay controlling unit 424 may be a digital-to-analog converter that converts the received delay setting data into an analog control voltage. In this case, the delay controlling unit 424 controls a power source current generated from the current sources included in the corresponding first delay element 310 and second delay element 330 using the control voltage.

The inverter 420 and the inverter 422 transfer the delay setting data held in the flip-flop 416 and the flip-flop 418 to the delay control block 410 in the next stage. The delay control block 410 in the next stage similarly controls a delay amount of the corresponding delay block based on the received delay setting data.

For example, the flip-flops 416 and 418 of the second delay control block 410 separately receive the signal input into the first delay block 300-1, and acquire the delay setting data to control the delay amount according to the signal to be input into the first delay block 300-1. Then, the delay controlling unit 424 of the second delay control block 410 controls a delay amount in the second delay block 300-2 based on the delay setting data acquired by the flip-flops 416 and 418.

Moreover, the delay amount that each delay control block 410 sets for the corresponding delay block is generally same. That is, each delay control block 410 controls a delay amount of the corresponding delay block based on the same delay setting data. For example, when having two delay control blocks 410 like this example, the first delay control block 410-1 and the second delay control block 410-2 control the delay amounts of the first delay block 300-1 and the second delay block 300-2 so that the delay blocks have the generally same value.

Each delay block may have a delay error with respect to each delay setting data due to element variations. For this reason, in case of controlling a delay amount by means of the different delay setting data for each delay block, when the sum of the delay errors of each delay block is the worst delay error, the affect of the delay error in a certain delay block becomes large, and thus the delay with high precision can not be generated. Meanwhile, according to the delay circuit 400 in this example, since a delay amount of each delay block is generally equal, a delay error in each delay block can be averaged and thus a possibility of the worst delay error can be reduced.

Figure 5:
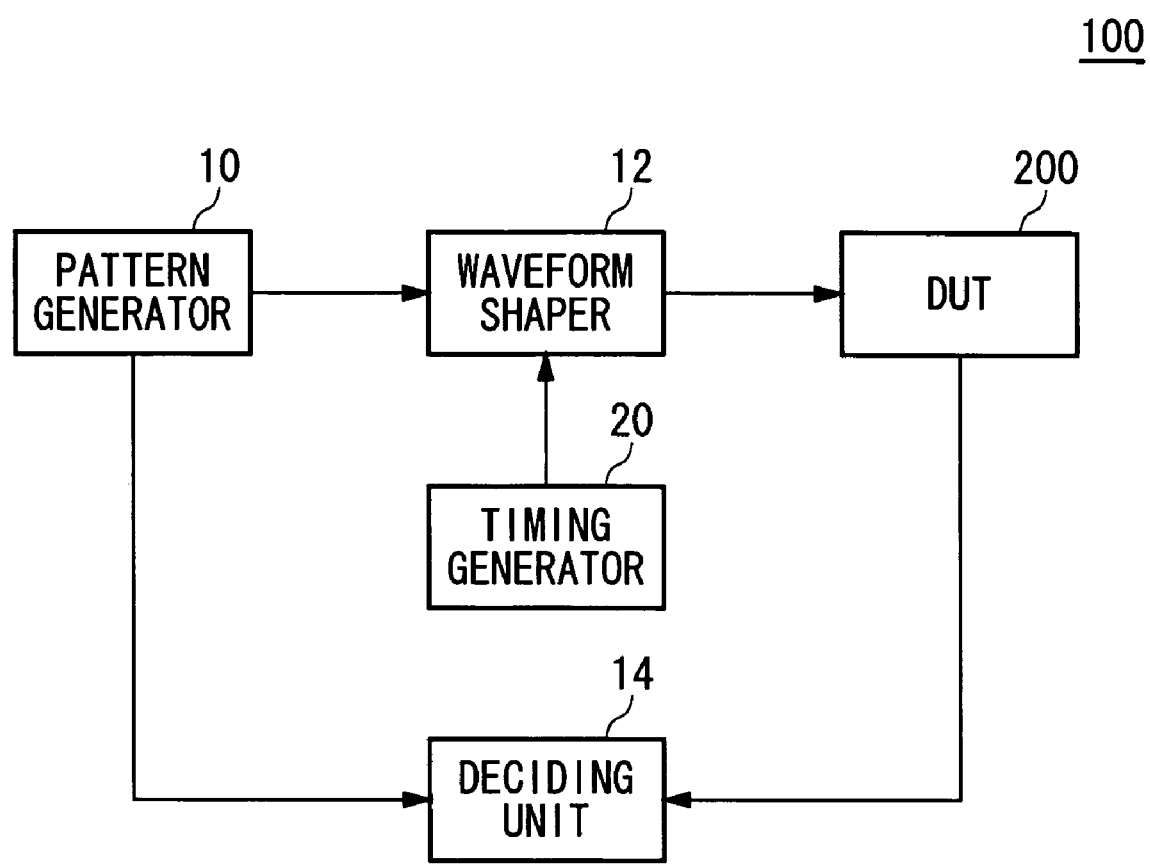
FIG. 5 is a view exemplary showing a configuration of a test apparatus according to an embodiment of the present invention.

FIG. 5 is a view exemplary showing a configuration of a test apparatus 100 according to an embodiment of the present invention. The test apparatus 100 tests a device under test 200 such as a semiconductor device. In this example, the test apparatus 100 includes a pattern generator 10, a waveform shaper 12, a timing generator 20, and a deciding unit 14.

The pattern generator 10 generates a test pattern to test the device under test 200, and supplies it to the waveform shaper 12. The waveform shaper 12 supplies a test signal made by shaping the received test pattern to the device under test 200 according to the timing acquired from the timing generator 20.

The timing generator 20 is, e.g., a delay circuit, and delays a given reference clock by a desired delay amount to supply the delayed clock to the waveform shaper 12 so as to control the timing in which the waveform shaper 12 supplies the test signal. In this example, the timing generator 20 is the delay circuit 300 or the delay circuit 400 explained in FIGS. 1 to 4. In this case, the delay circuit 300 or the delay circuit 400 receives a reference clock as an input signal, and delays the input signal with a delay amount set previously to supply the delayed signal to the waveform shaper 12.

Moreover, the deciding unit 14 decides the good or bad of the device under test 200 by comparing the output signal output from the device under test according to the test signal and an expected value signal to be given from the pattern generator 10.

According to the test apparatus 100 in this example, as described in FIGS. 1 to 4, since it is capable to delay the reference clock with high precision to supply it to the waveform shaper 12, it is possible to decide the good or bad of the device under test 200 with high precision.

Figure 6:
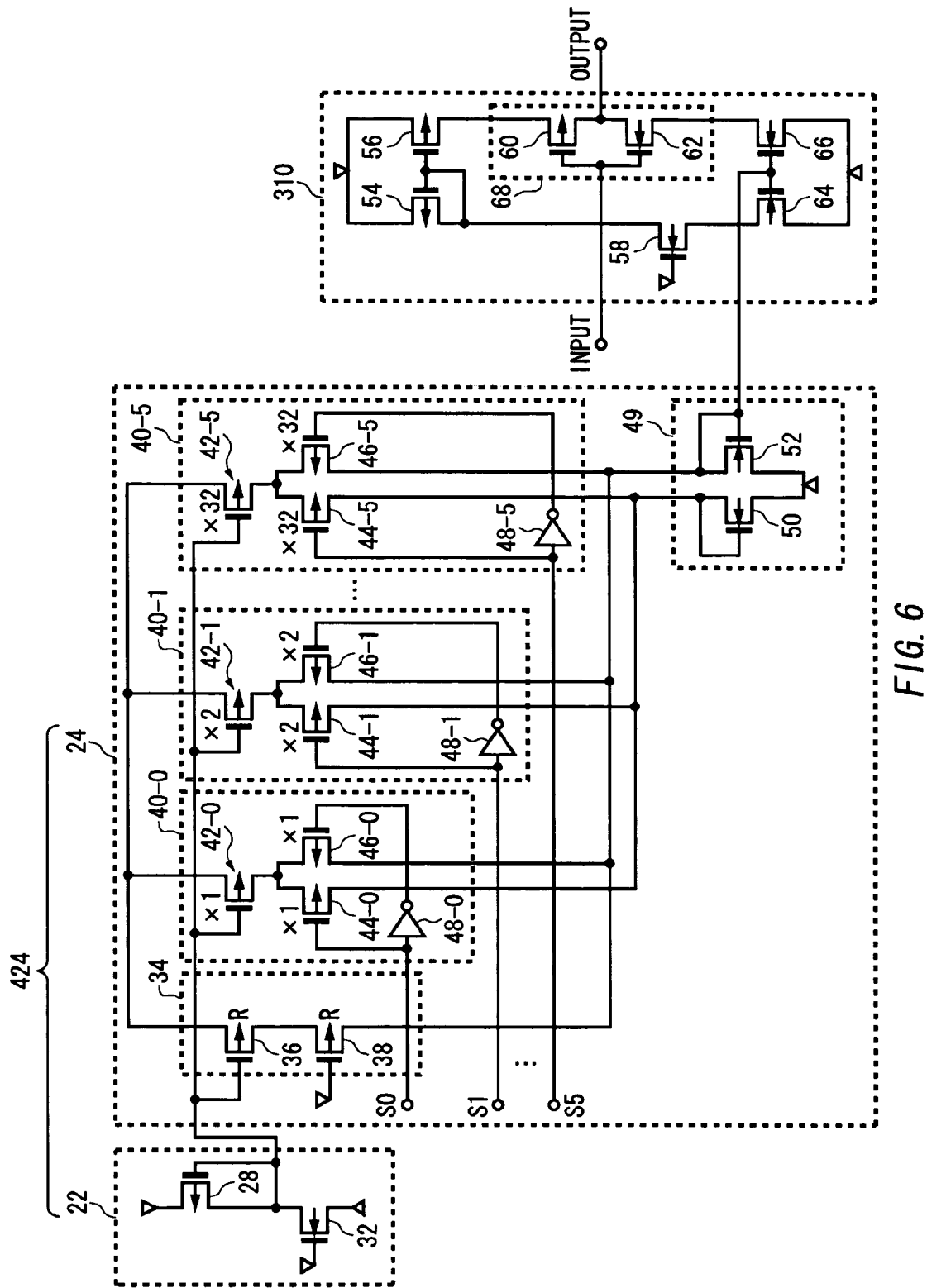
FIG. 6 is a view exemplary showing a configuration of a delay controlling unit and a first delay element explained in FIG. 4.

FIG. 6 is a view exemplary showing configurations of the delay controlling unit 424 and the first delay element 310 explained in FIG. 4. In FIG. 6, a configuration except for the delay controlling unit 424 and the first delay element 310 will not be described. In this example, the delay controlling unit 424 has a basic current source 22 and a current-voltage converting unit 24. Moreover, in this example, although a configuration of the first delay element 310 is shown, the second delay element 330 may also have the same configuration.

The basic current source 22 and the current-voltage converting unit 24 generate a basic voltage according to delay setting data S0 to S5. The basic current source 22 generates a basic current of a predetermined DC. Then, the current-voltage converting unit 24 generates a basic voltage based on the basic current generated from the basic current source 22, and supplies it to the first delay element 310. At this time, the current-voltage converting unit 24 is supplied with a desired delay setting data in the timing generator 20, and generates a basic voltage of a level according to the delay setting data. In this example, the current-voltage converting unit 24 generates a current of a magnitude of any integral multiple that is k times to k+63 times of the basic current, and generates a basic voltage by converting the generated current into a voltage. As shown in FIG. 6, the current-voltage converting unit 24 receives 0 to 63 magnifications expressed by a binary number of six bits that are S0 to S5 as the delay setting data.

The first delay element 310 delays the input signal by a delay amount according to the given basic voltage to output the delayed signal. Next, the detailed configurations and operations of the basic current source 22, the current-voltage converting unit 24, and the first delay element 310 will be described.

The basic current source 22 has a p-MOS transistor 28 and an n-MOS transistor 32. Here, the p-MOS transistor is a p-channel type MOS (metal oxide semiconductor) transistor, and the n-MOS transistor is an n-channel type MOS transistor.

The p-MOS transistor 28 is supplied with a predetermined source voltage VD via its source terminal, and its gate terminal and its drain terminal is connected to each other. Moreover, the n-MOS transistor 32 is supplied with a predetermined gate voltage VG via its gate terminal, its drain terminal is connected to the drain terminal of the p-MOS transistor 28, and is supplied with a predetermined source voltage VS via its source terminal. By such a configuration, the basic current source 22 generates a predetermined basic current, and outputs a drain voltage and a gate voltage of the p-MOS transistor 28 to the current-voltage converting unit 24 as the predetermined voltage.

The current-voltage converting unit 24 has an offset current generating circuit 34, a plurality of delay amount conversion current generating circuits 40-0 to 40-5 (hereinafter referred to as 40), and a voltage converting circuit 49, and generates the basic voltage according to the delay setting data from the basic current.

Moreover, in this example, although the current-voltage converting unit 24 has six delay amount conversion current generating circuits 40, the number of delay amount conversion current generating circuits 40 is not limited to six. The current-voltage converting unit 24 has the delay amount conversion current generating circuits 40 of the number according to a necessary delay setting data range and delay setting data resolution.

The offset current generating circuit 34 and the plurality of delay amount conversion current generating circuits 40 are respectively provided in parallel in regard to the terminals that are supplied with the source voltage VD. The offset current generating circuit 34 generates an offset current of a magnitude of k times of the basic current. In this example, the offset current generating circuit 34 has k p-MOS transistors 36 that are provided in parallel and k p-MOS transistors 38 that are provided in parallel. Each p-MOS transistor 36 is supplied with the source voltage VD via its source terminal, and its drain terminal is connected to a source terminal of the p-MOS transistor 38. The p-MOS transistors in the present specification respectively have the generally same characteristic and respectively have the generally same conductive characteristic. Moreover, a gate terminal of the p-MOS transistor 36 is connected to the gate terminal of the p-MOS transistor 28. By such a configuration, the offset current of a magnitude of k times of the basic current flows into the offset current generating circuit 34.

Each delay amount conversion current generating circuit 40-x amplifies the basic current with magnification different from one another. Each delay amount conversion current generating circuit 40-x in this example generates a current having a magnitude of $2^x$ times of each basic current. Moreover, a bit of $S_x$ of each delay setting data is given to each delay amount conversion current generating circuit 40-x. Each delay amount conversion current generating circuit 40-x has a dummy current path and a delay amount conversion current path, and flows the generated current into the dummy current path when the given bit is zero and flows the generated current into the delay amount conversion current path when the given bit is one.

In this example, the delay amount conversion current generating circuits 40-x include $2^x$ p-MOS transistors 42-x that are provided in parallel, $2^x$ p-MOS transistors 44-x that are provided in parallel and function as the previously described dummy current path, $2^x$ p-MOS transistors 46-x that are provided in parallel and function as the previously described delay amount conversion current path, and inverter circuits 48-x.

Like the p-MOS transistor 36, the p-MOS transistor 42-x is supplied with the source voltage VD via its source terminal, and its gate terminal is connected to the gate terminal of the p-MOS transistor 28. In other words, a total current flowing into the $2^x$ p-MOS transistors 42-x provided in parallel is $2^x$ times of the basic current.

The p-MOS transistors 44-x and the p-MOS transistors 46-x are provided in parallel corresponding to the p-MOS transistors 42-x, and a bit of the delay setting data Sx is input into the gate terminal of the p-MOS transistor 44-x and an inverting bit of the delay setting data Sx is input into the gate terminal of the p-MOS transistor 46-x via the inverter circuit 48-x. In other words, the current flowing into the p-MOS transistor 42-x flows into either of the p-MOS transistor 44-x or the p-MOS transistor 46-x according to the delay setting data Sx.

In other words, the plurality of inverter circuits 48 functions as a selecting unit that selects one or a plurality of currents out of a plurality of currents respectively amplified in the plurality of delay amount conversion current generating circuits 40 based on the desired delay setting data, flows the selected current into the delay amount conversion current path, and flows the current not selected into the dummy current path.

The voltage converting circuit 49 generates a basic voltage based on a total current flowing into the delay amount conversion current path of each delay amount conversion current generating circuit 40. The voltage converting circuit 49 has a dummy transistor 50 and a conversion transistor 52. A drain terminal of the dummy transistor 50 is supplied with a total current flowing into the dummy current path of each delay amount conversion current generating circuit 40 and the conversion transistor 52 is supplied with a total current flowing into the delay amount conversion current path of each delay amount conversion current generating circuit 40. Moreover, the conversion transistor 52 is supplied with a predetermined source voltage VS via its source terminal, and its drain terminal and its gate terminal are connected to each other.

By such a configuration, a gate voltage of the conversion transistor 52 is a voltage according to the delay setting data, and the voltage converting circuit 49 supplies the gate voltage of the conversion transistor 52 to the first delay element 310 as a basic voltage. According to the current-voltage converting unit 24 in this example, a basic voltage according to a desired delay setting data can be generated. Moreover, the consumption current in the plurality of delay amount conversion current generating circuits 40 is constant irrespective of the delay setting data. Moreover, an offset current flowing into the offset current generating circuit 34 is a predetermined constant value according to a characteristic of the first delay element 310. Thus, although the delay setting data is changed in a real operation, the current-voltage converting unit 24 can keep a constant total consumption current and thus keep a constant calorific value. Therefore, it is possible to generate a basic voltage according to a delay setting data with high precision without fluctuating a characteristic of each transistor by the delay setting data.

The first delay element 310 has a delay element 68, a current supplying unit supplying a current to the delay element 68, and a control unit controlling the current supplying unit. In this example, the control unit consists of a p-MOS transistor 54 (a fourth MOS transistor), an n-MOS transistor 58, and an n-MOS transistor 64 (a third MOS transistor), and the current supplying unit consists of a p-MOS transistor 56 (a first MOS transistor) and an n-MOS transistor 66 (a second MOS transistor).

In this example, the delay element 68 is an inverter consisting of a p-MOS transistor 60 and an n-MOS transistor 62, and charges and discharges an output capacitance according to an input signal in order to delay the input signal to output the delayed signal. Moreover, since delay time of the delay element 68 depends upon the charging and discharging time of the output capacitance, the input signal is delayed and output for the delay time based on a supply current supplied from the current supplying unit. In this example, the p-MOS transistor 56 supplies a charging current to charge the output capacitance of the delay element 68, and the n-MOS transistor 66 supplies a discharge current to discharge the output capacitance of the delay element 68.

In this example, a reference clock is supplied to the delay element 68 as the input signal. Moreover, the delay element 68 is provided in parallel with the inverter between the inverter and the output terminal, and may further have a capacitor having variable capacity. In this case, it is preferable to control capacity of the capacitor based on a variable range of the desired delay setting data.

A control current according to the given basic voltage flows into the control unit. Moreover, each transistor of the current supplying unit is connected to a transistor of the control unit to form a current mirror circuit, and generates the generally same supply current as the control current. Therefore, since the current-voltage converting unit 24 generates the basic voltage according to the desired delay setting data, it is possible to easily control a delay amount of the delay element 68.

The control unit converts a basic voltage supplied from the current-voltage converting unit 24 into a control voltage according to a characteristic of the current supplying unit, and supplies it to the current supplying unit, in order to generate the supply current in the current supplying unit. The control current according to the given basic voltage flows into each transistor of the control unit, and thus the control voltage based on the control current is generated. At this time, it is preferable that the control unit generates a first control voltage by which the p-MOS transistor 56 operates in a saturation range and supplies it to a gate terminal of the p-MOS transistor 56. Moreover, it is preferable that the control unit generates a second control voltage by which then-MOS transistor 66 operates in a saturation range and supplies it to a gate terminal of the n-MOS transistor 66.

A source terminal of the p-MOS transistor 54 is supplied with a predetermined source voltage VD, and its gate terminal and its drain terminal are electrically connected to each other. In other words, the p-MOS transistor 54 functions as a resistor that generates potential difference according to the control current between the drain terminal and the source terminal. The P-MOS transistor 54 generates the first control voltage to control the supply current generated from the p-MOS transistor 56 based on the potential difference. Moreover, the drain terminal of the p-MOS transistor 54 is electrically connected to the drain terminal of the n-MOS transistor 64 through the n-MOS transistor 58.

The predetermined source voltage VS is supplied to the source terminal of the n-MOS transistor 64. Moreover, the gate terminal and the drain terminal of the conversion transistor 52 are electrically connected to each other. The gate terminal of the n-MOS transistor 64 is supplied with a basic voltage from the conversion transistor 52, and a magnitude of the control current is restricted according to the basic voltage. In other words, the n-MOS transistor 64 functions as a resistor that generates a voltage according to the control current between the drain terminal and the source terminal similarly to the conversion transistor 52. The conversion transistor 52 generates the second control voltage to control the supply current generated from the n-MOS transistor 66 based on the potential difference.

The p-MOS transistor 54 and p-MOS transistor 56 and the n-MOS transistor 64 and n-MOS transistor 66 are respectively connected to form a current mirror circuit as shown in FIG. 6, and respectively generate the generally same drain current. Moreover, in the first delay element 310, when the same gate voltage and drain voltage are given, it is preferable that each n-MOS transistor and p-MOS transistor has a characteristic such that their drain currents are substantially identical. For example, each transistor may have the gate width and the gate length such that their drain currents are substantially identical in that condition, or may use a group of p-MOS transistors provided in parallel as one p-MOS transistor.

Moreover, in another example, the n-MOS transistor 64 may be a group of n n-MOS transistors provided in parallel, and the n-MOS transistor 66 may be a group of m n-MOS transistors provided in parallel. In this way, it is possible to set a ratio between the control current and the supply current to n: m and thus to generate a desired supply current by adjusting the number of MOS transistors connected in parallel to form a current mirror circuit.

Moreover, it is preferable that the offset current generating circuit 34 of the current-voltage converting unit 24 generates the offset current of a magnitude, by which the p-MOS transistors 54 and 56 and the n-MOS transistors 64 and 66 operate in a saturation range, in a range of the delay setting data. Here, the saturation range is a range in which they operate in a state that the potential difference between the drain terminal and the source terminal of the MOS transistor is larger than the result obtained by subtracting a threshold voltage determined by a characteristic of the MOS transistor from the potential difference between the gate terminal and the source terminal. Since each transistor of the current supplying unit can be operated in a saturation range, a magnitude of the supply current fluctuates linearly for the variation of the delay setting data. Therefore, it is possible to control a delay amount of the delay element 68 with high precision. The offset current value to operate each transistor in a saturation range can easily be determined by measuring it previously.

Figure 7:
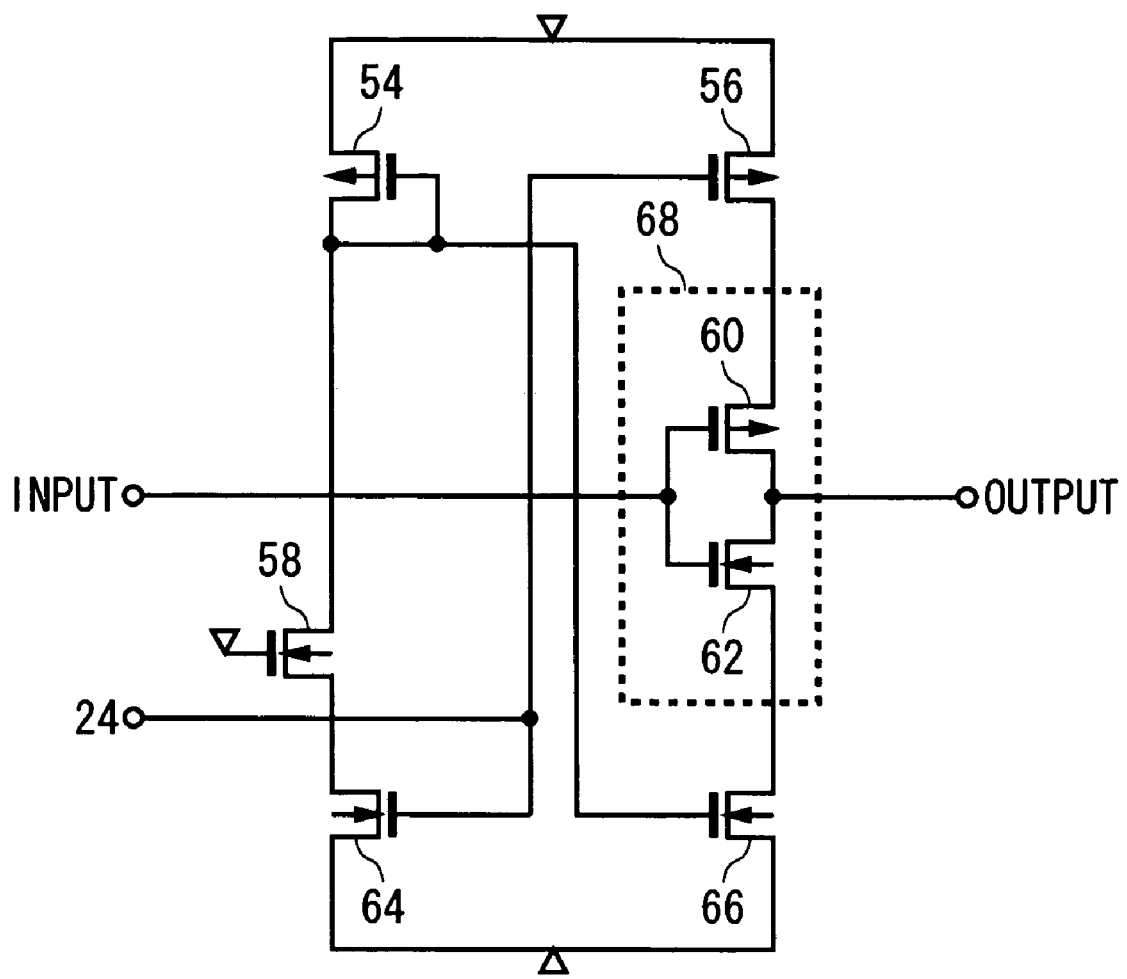
FIG. 7 is a view showing another example of a configuration of the first delay element.

FIG. 7 shows another example of a configuration of the first delay element 310. The first delay element 310 in this example has particularity compared with a configuration of the first delay element 310 explained in FIG. 6 in that the gate connection of each of the p-MOS transistor 54, the n-MOS transistor 64, the p-MOS transistor 56, and the n-MOS transistor 66 is different. Since a configuration of the first delay element 310 of this example is the same as that of the first delay element 310 explained in FIG. 6, its description will be omitted.

In this example, the gate terminal of the n-MOS transistor 64 and the gate terminal of the p-MOS transistor 56 are electrically connected. In other words, the n-MOS transistor 58 generates the first control voltage to control the p-MOS transistor 56 based on the potential difference between the drain terminal and the source terminal caused by the control current.

Moreover, the gate terminal and drain terminal of the p-MOS transistor 54 and the gate terminal of the n-MOS transistor 66 are electrically connected. In other words, the p-MOS transistor 54 generates the second control voltage to control the n-MOS transistor 66 based on the potential difference between the drain terminal and the source terminal.

In FIG. 6, the control current flowing into the control unit and the supply current generated from the current supplying unit are the generally same as each other. However, the current supplying unit in this example generates the supply current different from the control current. Moreover, in this example, the offset current generating circuit 34 generates the offset current of a magnitude, by which the n-MOS transistor 64 and the p-MOS transistor 54 operate in the linear region and the p-MOS transistor 56 and the n-MOS transistor 66 operate in the saturation range, in a range of the delay setting data. Here, the linear region is a range in which they operate in a state that the potential difference between the drain terminal and the source terminal of the MOS transistor is larger than the result obtained by subtracting a threshold voltage determined by a characteristic of the MOS transistor from the potential difference between the gate terminal and the source terminal.

According to this example, since each transistor of the current supplying unit operates in a saturation range, a magnitude of the supply current fluctuates linearly for the variation of the delay setting data. Therefore, it is possible to control a delay amount of the delay element 68 with high precision. Moreover, since each transistor of the control unit operates in a linear region, it is possible to reduce an amount of consumption current in the control unit.

Figure 8:
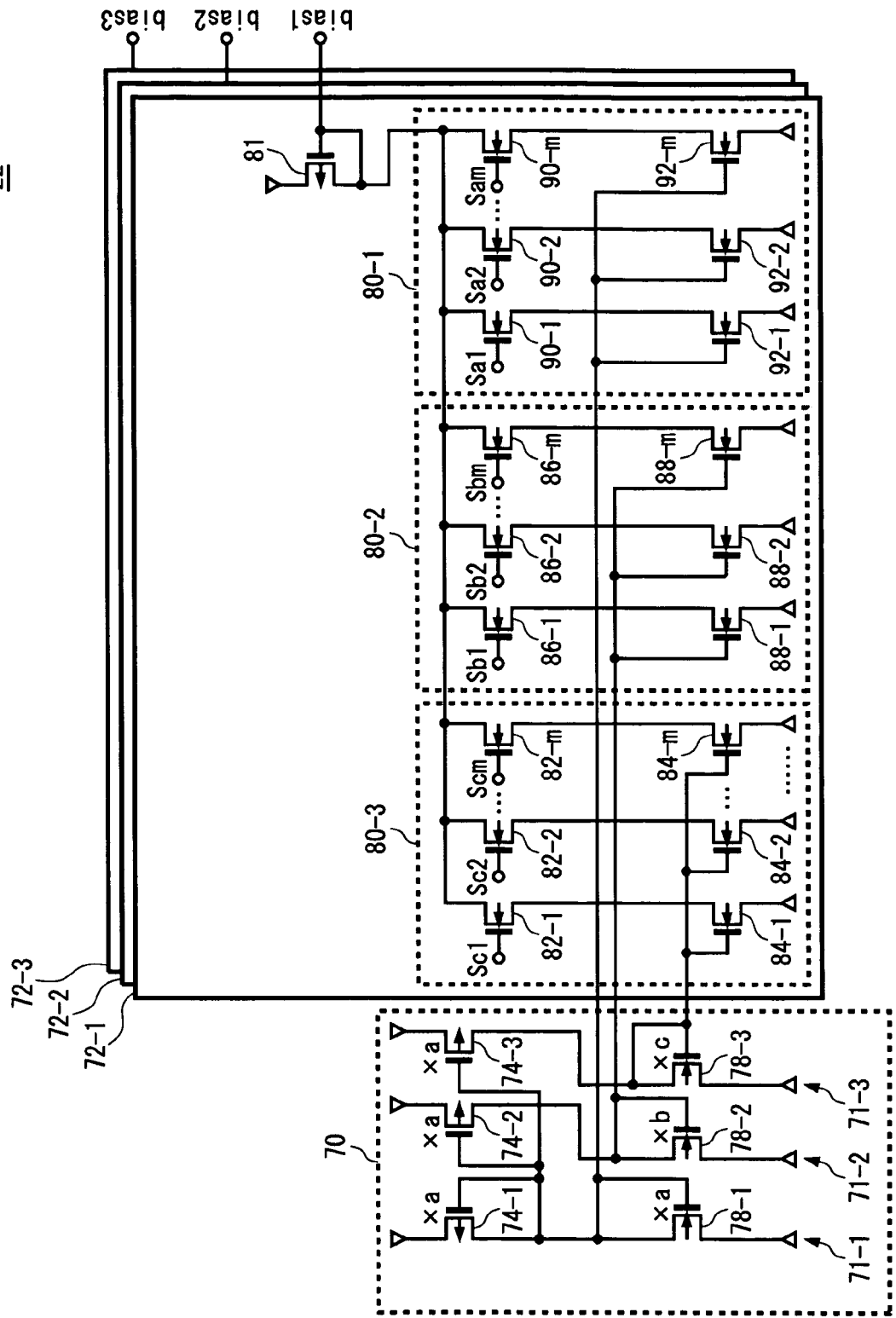
FIG. 8 is a view showing another example of a configuration of a basic current source.

FIG. 8 is a view showing another example of a configuration of the basic current source 22. The basic current source 22 in this example generates the plurality of basic currents having a magnitude different from one another according to resolution of the delay setting data. When using the basic current source 22 in this example, it is preferable that the current-voltage converting unit 24 has a configuration described below using FIG. 10 or 11. The basic current source 22 and the current-voltage converting unit 24 explained in FIG. 6 generate a basic voltage based on one basic current. Therefore, the resolution of the basic voltage is determined by a magnitude of a predetermined basic current. Meanwhile, the basic current source 22 in this example generates a plurality of basic currents of which a magnitude can be adjusted arbitrarily. In this case, since the current-voltage converting unit 24 can generate a basic voltage using the plurality of basic currents having a magnitude different from one another as resolution, the current-voltage converting unit 24 can generate the basic voltage using fine resolution in wider range. In other words, it is possible to control a delay amount of the first delay element 310 using fine resolution in wider range.

The basic current source 22 in this example has a current source 70 of which a magnitude can adjust arbitrarily and a plurality of basic current converting units 72-1 to 72-3 (hereinafter, referred to as 72). The current source 70 has a plurality of reference current sources that generates reference currents having a magnitude different from one another. In this example, the current source 70 has a first reference current source 71-1, a second reference current source 71-2, and a third reference current source 71-3. The first reference current source 71-1 has p-MOS transistors 74-1 that are provided in parallel and of which the number is a and n-MOS transistors 78-1 that are provided in parallel and of which the number is a. Moreover, the second reference current source has p-MOS transistors 74-2 that are provided in parallel and of which the number is a and n-MOS transistors 78-2 that are provided in parallel and of which the number is b. Moreover, the third reference current source has p-MOS transistors 74-3 that are provided in parallel and of which the number is a and n-MOS transistors 78-3 that are provided in parallel and of which the number is c (here, a, b, and c are an integer satisfying a<b<c).

The p-MOS transistors 74 are connected to form a current mirror circuit, and the substantially same current a×$I_0$ flows into each reference current source. The first reference current source 71-1 divides the first reference current a×$I_0$ to flow into each of the n-MOS transistors 78-1 that are provided in parallel and of which the number is a, and generates the first reference current $I_0$.

Moreover, the second reference current source 71-2 divides the current a×$I_0$ to flow into each of the n-MOS transistors 78-2 that are provided in parallel and of which the number is b, and generates the second reference current that is a/b times of the first reference current. In other words, the current $I_0$×a/b flowing into one n-MOS transistor 78-2 is considered as the second reference current.

Moreover, the third reference current source 71-3 divides the current a×$I_0$ to flow into each of the n-MOS transistors 78-3 that are provided in parallel and of which the number is c, and generates the third reference current that is a/c times of the first reference current. In other words, the current $I_0$×a/c flowing into one n-MOS transistor 78-2 is considered as the third reference current.

Then, the plurality of basic current converting units 72 generates the basic currents having a magnitude different from one another based on the first reference current, the second reference current, and the third reference current. Each basic current converting unit 72 has a plurality of amplifying units corresponding to the plurality of reference current sources and a p-MOS transistor. In this example, the basic current converting unit 72 has a first amplifying unit 80-1, a second amplifying unit 80-2, and a third amplifying unit 80-3.

The first amplifying unit 80-1 has a plurality of n-MOS transistors 92-1 to 92-*m* (hereinafter, referred to as 92) and a plurality of switches 90-1 to 90-*m* (hereinafter, referred to as 90). The n-MOS transistors 92 are respectively connected to the n-MOS transistor 78-1 to form a current mirror circuit. Moreover, the switches 90 are respectively provided corresponding to the n-MOS transistors 92, and selects whether the current flows into the corresponding n-MOS transistors

92. Since the plurality of switches 90 is controlled to control the number of n-MOS transistors 92 into which the current having the same magnitude as the first reference current flows, it is possible to generate the current that is made by amplifying the first reference current to a magnitude of any integer times.

Moreover, the second amplifying unit 80-2 and the third amplifying unit 80-3 have the same configuration as that of the first amplifying unit 80-1, and respectively generate the currents that is made by amplifying the second reference current and the third reference current to a magnitude of any integer times.

Then, the p-MOS transistor 81 generates the total current respectively generated from the first amplifying unit 80-1,- the second amplifying unit 80-2, and the third amplifying unit 80-3 as the basic current, and outputs a voltage according to the basic current. By such a configuration, the basic current converting unit 72 can generate the basic current of an arbitrary magnitude. Moreover, since the plurality of basic current converting units 72 respectively operates independently, the basic current source 22 can easily generate a plurality of basic currents respectively having an arbitrary magnitude. The resolution of a delay amount of the first delay element 310 is determined by the magnitude of the basic current generated from the basic current source 22. However, according to the basic current source 22 in this example, it is possible to generate the basic current suitable for the resolution of the necessary delay amount. Moreover, since the plurality of basic currents having a magnitude different from one another, the basic current source 22 can correspond to the case where fine resolution becomes necessary as the delay setting data in a wide area.

Figure 9:
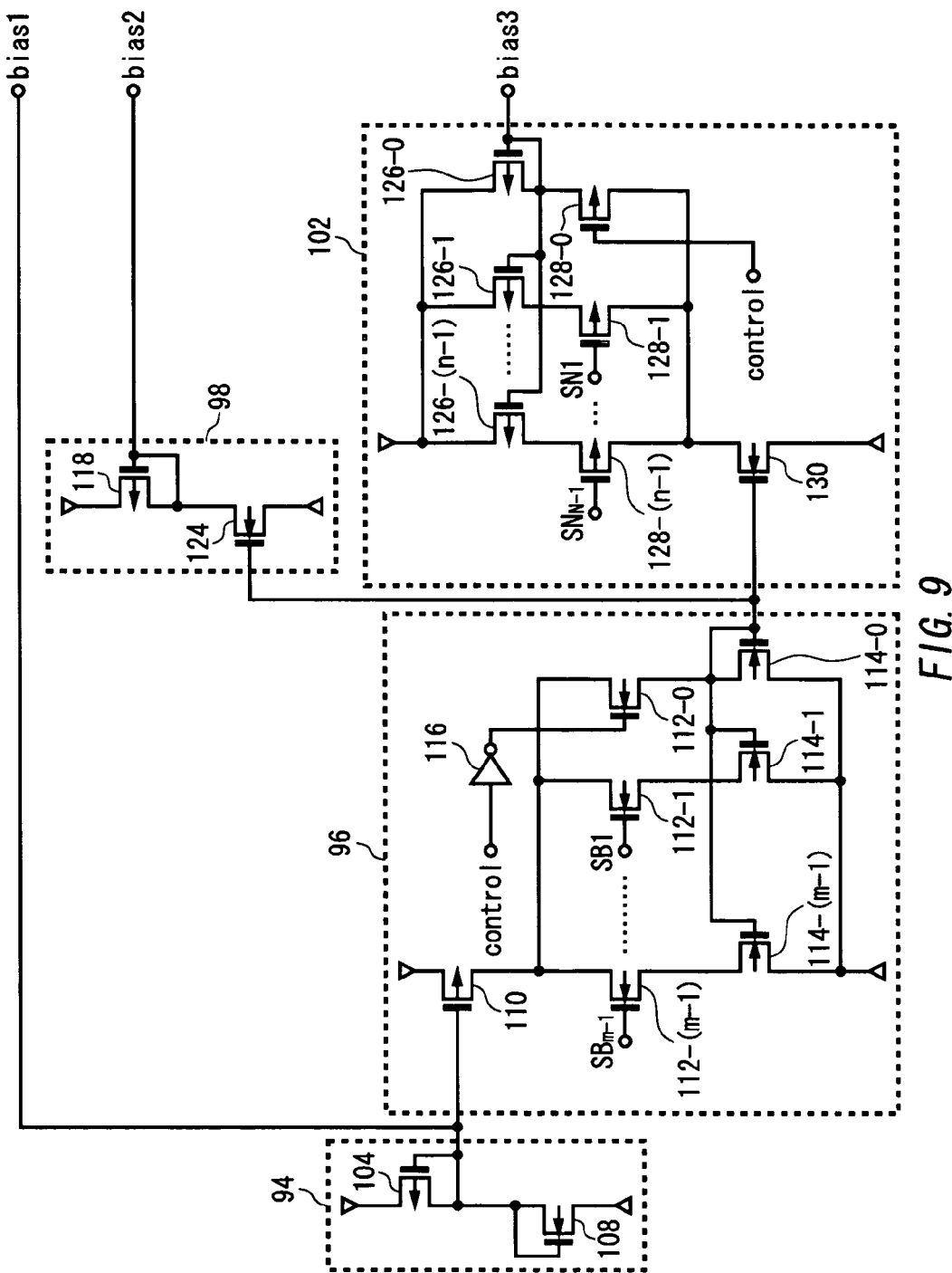
FIG. 9 is a view showing still another example of a configuration of the basic current source.

FIG. 9 is a view showing further another example of a configuration of the basic current source 22. The basic current source 22 in this example generates the plurality of basic currents having a magnitude different from one another according to resolution of the delay setting data. When using the basic current source 22 in this example, it is preferable that the current-voltage converting unit 24 has a configuration described below using FIG. 10 or 11.

The basic current source 22 in this example has a current source 94, a plurality of current dividing units 96 and 102, and a mirror circuit 98. The current source 94 has a p-MOS transistor 104 and an n-MOS transistor 108. The p-MOS transistor 104 and the n-MOS transistor 108 are serially provided between predetermined drain electric potential VD and predetermined source electric potential VS, and generate the first basic current having a predetermined magnitude.

The first current dividing unit 96 divides the first basic current to flow into a plurality of transistors provided in parallel, and generates the second basic current having a magnitude of one-INTEGERth times of the first basic current. In this example, the first current dividing unit 96 has a p-MOS transistor 110, a plurality of n-MOS transistors 112, and a plurality of n-MOS transistors 114.

The p-MOS transistor 110 is connected to the p-MOS transistor 104 to form a current mirror circuit, and flows the first basic current. Then, the plurality of n-MOS transistors 114 is respectively provided in parallel corresponding to the p-MOS transistor 110, and divides the first basic current. Moreover, the plurality of n-MOS transistors 112 is provided corresponding to the plurality of n-MOS transistors 114, and selects whether the first basic current is divided and supplied to the corresponding n-MOS transistors 114. However, the n-MOS transistor 112 in this example always divides the first basic current to flow into the corresponding n-MOS transistor 114, and generates the second basic current. Similarly to the amplifying unit 80 explained in FIG. 8, since the number of the n-MOS transistors 114 that divide the first basic current is controlled, it is possible to control the second basic current flowing into the n-MOS transistor 114-0 with a magnitude of 1/w times (here, w is an arbitrary integer) of the first basic current.

The mirror circuit 98 is connected to the n-MOS transistor 114 to form a current mirror circuit, and has an n-MOS transistor 124 that flows the second basic current and a p-MOS transistor 118 that is serially connected to the n-MOS transistor 124 and into which the second basic current flows. Then, the p-MOS transistor 118 is connected to a p-MOS transistor of the current-voltage converting unit 24 to form a current mirror circuit described below using FIGS. 10 and 11.

Figure 10:
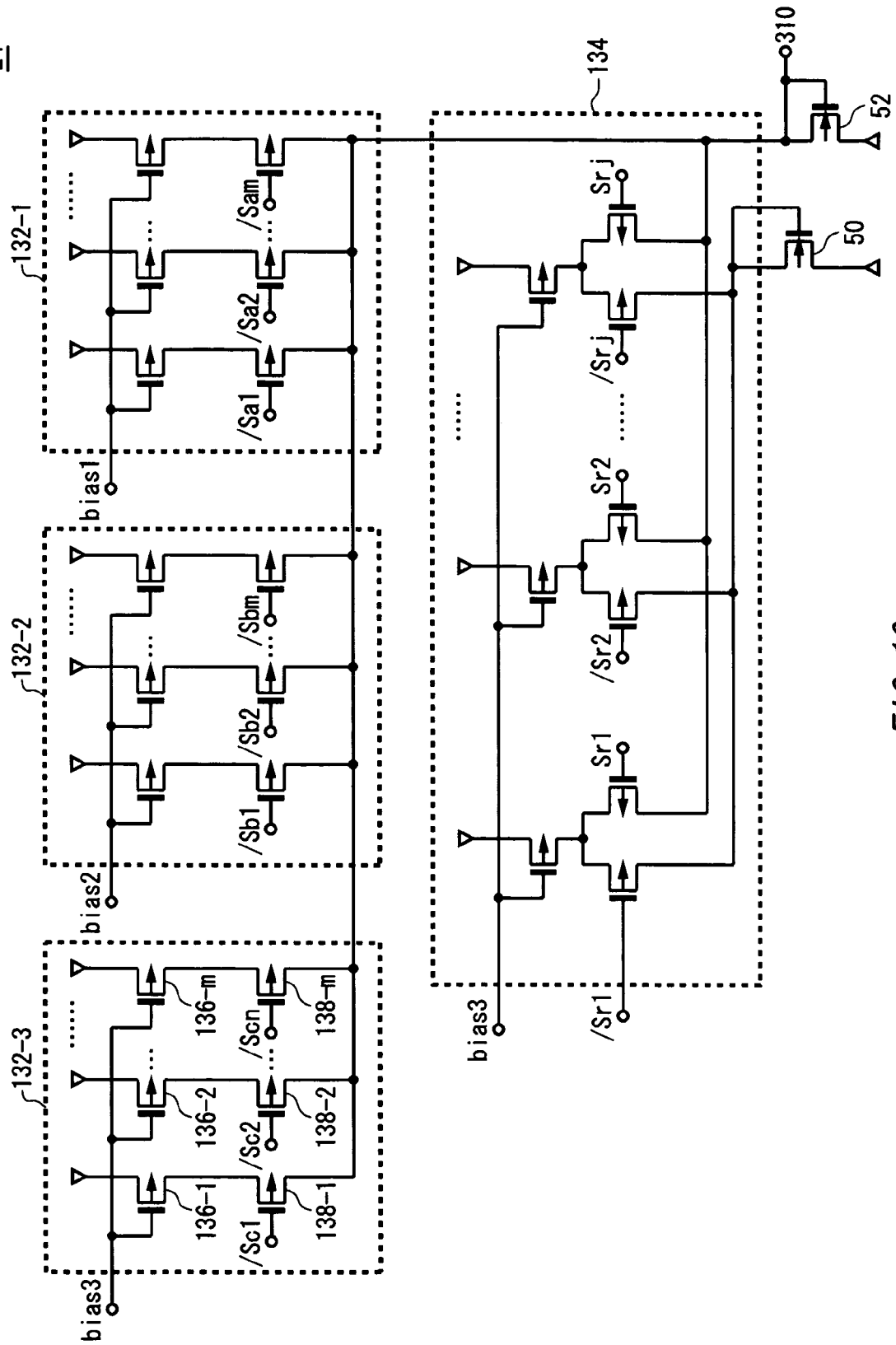
FIG. 10 is a view showing another example of a configuration of a current-voltage converting unit.
Figure 11:
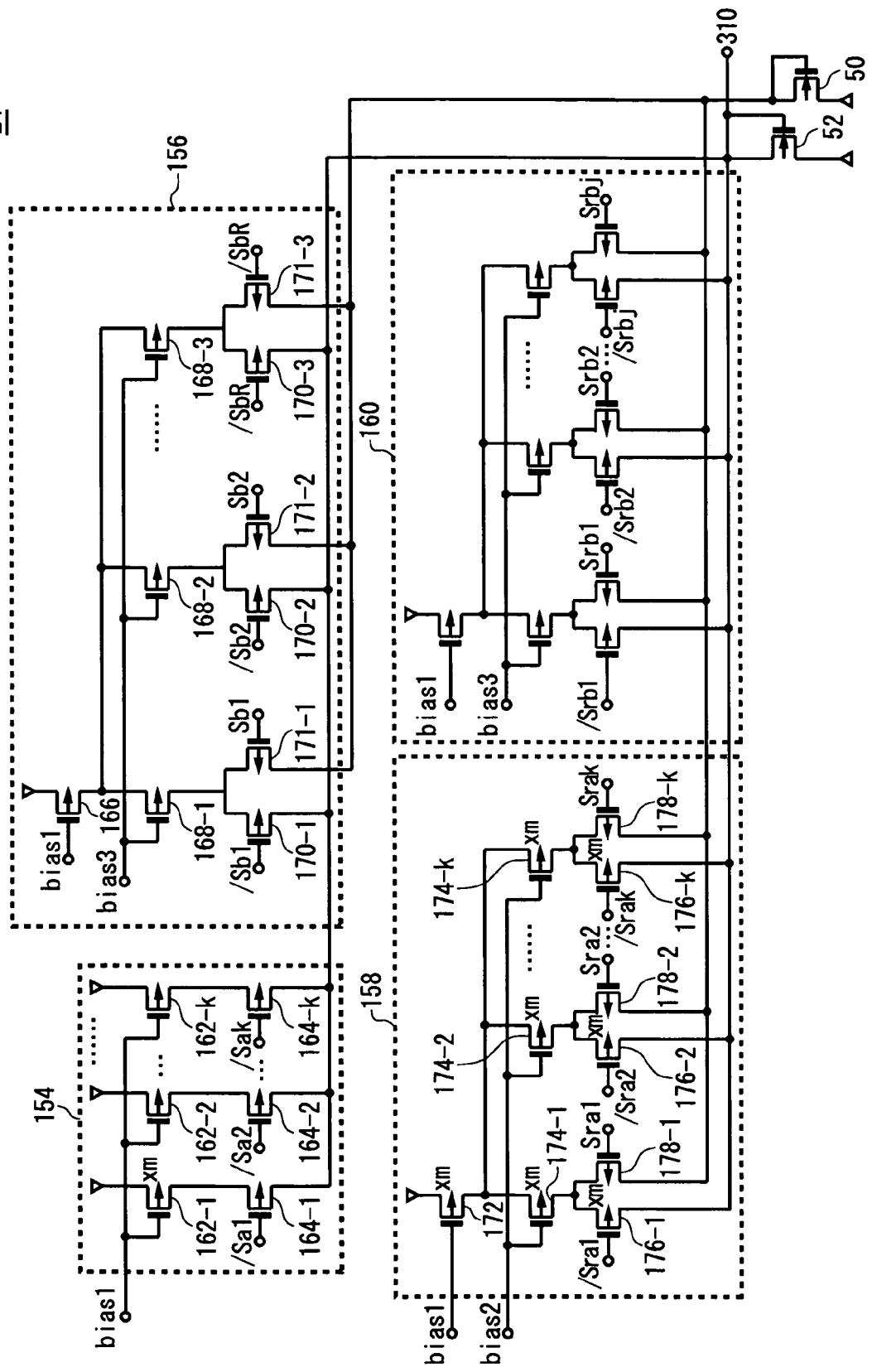
FIG. 11 is a view showing still another example of a configuration of the current-voltage converting unit.

As shown in FIGS. 10 and 11, the basic current source 22 and the current-voltage converting unit 24 transfer the basic current by connecting the p-MOS transistors to form a current mirror circuit. By using the mirror circuit 98 in this example, although the basic current is generated using the n-MOS transistor like the first current dividing unit 96, it is possible to easily transfer the basic current to the p-MOS transistor of the current-voltage converting unit 24.

Moreover, the second current dividing unit 102 divides the second basic current to flow into a plurality of transistors provided in parallel like the first current dividing unit 96, and generates the third basic current of a magnitude of one-INTEGERth times of the second basic current. In this example, the second current dividing unit 102 has an n-MOS transistor 130, a plurality of p-MOS transistors 128, and a plurality of p-MOS transistors 126.

The n-MOS transistor 130 is connected to the n-MOS transistor 114 to form a current mirror circuit, and flows the second basic current. Then, the plurality of p-MOS transistors 126 divides the second basic current like the plurality of n-MOS transistors 112, and the plurality of p-MOS transistors 128 selects whether the second basic current is divided to flow into the corresponding p-MOS transistors 126. According to the basic current source 22 in this example, it is possible to generate a plurality of basic currents having a magnitude different from one another by small circuit scale.

FIG. 10 is a view showing another example of a configuration of the current-voltage converting unit 24. The current-voltage converting unit 24 in this example receives the plurality of basic currents having a magnitude different from one another, amplifies each basic current according to the delay setting data, and generates a basic voltage to be supplied to the first delay element 310 based on the sum of the plurality of amplified basic currents.

The current-voltage converting unit 24 in this example has a plurality of offset current generating circuits 132-1 to 132-3 (hereinafter, referred to as 132), an amplifying unit 134, a dummy transistor 50, and a conversion transistor 52. The functions of the dummy transistor 50 and the conversion transistor 52 are the same as those of the dummy transistor 50 and the conversion transistor 52 explained in FIG. 6.

Each offset current generating circuit 132 receives the basic currents having a magnitude different from one another from the basic current source 22 explained in FIG. 8 or 9, respectively amplifies the received basic currents, and supplies the sum of the amplified offset currents to the conversion transistor 52. For example, the plurality of offset current generating circuits 132 may be provided corresponding to the plurality of basic current converting units 72 described in FIG. 8, or may respectively be provided corresponding to the current source 94, the second current dividing unit 102, and the mirror circuit 98 described in FIG.

9. In this example, it will be described about when the offset current generating circuits 132-1 to 132-3 are provided corresponding to the basic current converting unit 72-1 to 72-3.

Each offset current generation circuit 132 has a plurality of p-MOS transistors 136-1 to 136-m (hereinafter, referred to as 136) and a plurality of p-MOS transistors 138-1 to 138-m (hereinafter, referred to as 138).

The plurality of p-MOS transistors 136 is respectively connected to the p-MOS transistors 81 of the corresponding basic current converting units 72 to form a current mirror circuit. Then, the plurality of p-MOS transistors 138 is provided corresponding to the plurality of p-MOS transistors 136, and selects whether the current flows into the corresponding p-MOS transistors 136. The offset current having a magnitude of arbitrary integer times of the corresponding basic current can be generated by controlling the number of p-MOS transistors 136 that flow the current.

According to the plurality of offset current generating circuits 132 in this example, the offset current capable of being changed using the smallest basic current as resolution can be generated by arbitrarily amplifying and adding the plurality of basic currents in amplification range of the largest basic current.

Moreover, the amplifying unit 134 receives the basic current generated from either of the plurality of basic current converting units 72, and amplifies the received basic current according to the delay setting data. The amplifying unit 134 may have a configuration and function that except the configuration and function of the offset current generating circuit 34, the dummy transistor 50, and the conversion transistor 52 from the current-voltage converting unit 24 explained in FIG. 6. Moreover, the amplifying unit 134 may amplify the smallest basic current among the plurality of basic currents based on the delay setting data. According to the current-voltage converting unit 24 in this example, it is possible to set the offset current to a desired current.

FIG. 11 shows further another example of a configuration of the current-voltage converting unit 24. The current-voltage converting unit 24 in this example receives a plurality of basic currents having a magnitude different from one another, amplifies each basic current according to the delay setting data, and generates a basic voltage to be supplied to the first delay element 310 based on the sum of the plurality of amplified basic currents. In other words, the current-voltage converting unit 24 in this example sets the offset current and the basic voltage with a plurality of tones.

The current-voltage converting unit 24 in this example has a rough offset current generating circuit 154, a fine offset current generating circuit 156, a rough amplifying unit 158, a fine amplifying unit 160, a dummy transistor 50, and a conversion transistor 52. The function of the dummy transistor 50 and the conversion transistor 52 is the same as that of the dummy transistor 50 and the conversion transistor 52 explained in FIG. 6. Moreover, in this example, it will be described about when the basic current source 22 has the configuration shown in FIG. 9.

The rough offset current generating circuit 154 and the fine offset current generating circuit 156 amplify one or a plurality of basic currents at least including the largest basic current among the plurality of basic currents to generate an offset current, generate the offset current that is made by amplifying the respectively different basic currents by arbitrary inter times, and supply it to the conversion transistor 52. For example, the rough offset current generating circuit 154 amplifies the first basic current, and the fine offset current generating circuit 156 amplifies the third basic current. In this example, the rough offset current generating circuit 154 generates the offset current using the first basic current as resolution, and the fine offset current generating circuit 156 generates the offset current using the third basic current smaller than the first basic current as resolution.

The rough offset current generating circuit 154 receives the largest basic current among the plurality of basic currents, and generates the offset current that is made by amplifying the received basic current by arbitrary integer times. The rough offset current generating circuit 154 has the same configuration and function as those of the offset current generating circuit 132 explained in FIG. 10, has a plurality of p-MOS transistors 162 that is connected to the p-MOS transistor 104 of the current source 94 to form a current mirror circuit, and receives the first basic current.

Moreover, the fine offset current generating circuit 156 receives the basic current smaller than the basic current received by the rough offset current generating circuit 154, and generates the offset current that is made by amplifying the received basic current by arbitrary integer times. However, the offset current generated from the fine offset current generating circuit 156 in this example is smaller than the first basic current received by the rough offset current generating circuit 154. The fine offset current generating circuit 156 in this example has a p-MOS transistor 166, a plurality of p-MOS transistors 168, a plurality of p-MOS transistors 170, and a plurality of p-MOS transistors 171.

The p-MOS transistor 166 is connected to the p-MOS transistor 104 of the current source 94 to form a current mirror circuit. In other words, the p-MOS transistor 166 restricts a maximum value of the sum of the currents flowing into the plurality of p-MOS transistors 168 to the first basic current. Moreover, the plurality of p-MOS transistors 168 is connected in parallel with the p-MOS transistor 166, is respectively connected to the p-MOS transistor 126-0 of the second current dividing unit 102 to from a current mirror circuit, and respectively flows the same current as the third basic current.

Moreover, the plurality of p-MOS transistors 176 has the same function as that of the plurality of p-MOS transistors 44, and the plurality of p-MOS transistors 178 has the same function as that of the plurality of p-MOS transistors 46. The plurality of p-MOS transistors 170 is respectively connected to the dummy transistor 50, and the plurality of p-MOS transistors 171 is respectively connected to the conversion transistor 52. Then, according to the given offset time setting sb1 to sbj, they select whether the basic current received by each p-MOS transistor 168 is supplied to the dummy transistor 50 or the conversion transistor 52. In this way, while constantly holding consumption current in the fine offset current generating circuit 156, it is possible to supply the current according to the offset time setting to the conversion transistor 52. According to the rough offset current generating circuit 154 and the fine offset current generating circuit 156 in this example, it is possible to easily generate the offset current capable of being changed using the third basic current amplified by the fine offset current generating circuit 156 as resolution, between the minimum amplification range and the maximum amplification range of the first basic current amplified by the rough offset current generating circuit 154. In this case, the maximum value of the current capable of generated from the fine offset current generating circuit 156 may be substantially identical with the resolution of the current generated from the rough offset current generating circuit 154.

The rough amplifying unit 158 and the fine amplifying unit 160 amplify one or a plurality of basic currents at least including the smallest basic current among the plurality of basic currents based on the delay setting data, and supply it to the conversion transistor 52. In this example, the rough amplifying unit 158 and the fine amplifying unit 160 have the same configuration. For example, the rough amplifying unit 158 receives the second basic current and the fine amplifying unit 160 receives the third basic current, and they respectively amplify the received currents based on the delay setting data. In other words, it is possible to correspond to the delay setting data of a plurality of tones. It is possible to generate the current capable of being changed using the third basic current amplified by the fine amplifying unit 160 as resolution, between the minimum amplification range and the maximum amplification range of the second basic current amplified by the rough amplifying unit 158. In this case, the maximum value of the current capable of being generated by the fine amplifying unit 160 may be substantially identical with the resolution of the current generated by the rough amplifying unit 158. Moreover, the current respectively generated by the rough amplifying unit 158 and the fine amplifying unit 160 in this example is smaller than the first basic current received by the rough offset current generating circuit 154.

The rough amplifying unit 158 and the fine amplifying unit 160 have a p-MOS transistor 172, a plurality of p-MOS transistors 174, a plurality of p-MOS transistors 176, and a plurality of p-MOS transistors 178.

The p-MOS transistor 172 is connected to the p-MOS transistor 104 of the current source 94 to form a current mirror circuit. Moreover, the plurality of p-MOS transistors 174 has the same function as that of the plurality of p-MOS transistors 42 explained in FIG. 6, the plurality of p-MOS transistors 176 has the same function as that of the plurality of p-MOS transistors 44, and the plurality of p-MOS transistors 178 has the same function as that of the plurality of p-MOS transistors 46. Each p-MOS transistor 174 is connected to the p-MOS transistor 118 of the mirror circuit 98 or the p-MOS transistor 126-0 of the second current dividing unit 102 to form a current mirror circuit, and receives the second basic current or the third basic current.

Then, the plurality of p-MOS transistors 176 and the plurality of p-MOS transistors 178 select whether each p-MOS transistor 174 supplies the received basic current to the dummy transistor 50 or the conversion transistor 52 according to the given delay setting data. In this way, while constantly holding consumption current in the amplifying unit, it is possible to supply the current according to the delay setting data to the conversion transistor 52. Moreover, according to the rough amplifying unit 158 and the fine amplifying unit 160 in this example, it is possible to supply the current capable of being changed using the small basic current as resolution to the conversion transistor 52 in amplification range of the large basic current according to the delay setting data.

Moreover, it is preferable that the magnitude of each basic current is previously initialized so as to get linearity between the tones.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to delay an input signal with high precision. More particularly, it is possible to control a delay amount of the input signal with high precision when a plurality of delay elements is dependently connected to one another in order to largely delay the input signal. Moreover, it is possible to test a device under test with high precision by means of the signal of which the timing is controlled with high precision.

What is claimed is:

1. A delay circuit that delays an input signal to output the delayed signal, comprising:
   a first delay element operable to receive the input signal and delay the input signal to output the delayed signal;
   a buffer operable to receive the delay signal output from said first delay element and correct a dullness of a waveform of the delay signal generated from said first delay element to output the corrected signal, so that a rising time of the corrected, signal is substantially zero, wherein the rising time is duration that a voltage value of the rising edge of the delay signal takes to reach a predetermined threshold voltage; and
   a second delay element operable to receive the corrected signal output from said buffer and delay the corrected signal to output the delayed signal.

2. The delay circuit as claimed in claim 1, wherein said first delay element and said second delay element are variable delay elements that respectively have a delay amount according to a delay setting data set previously, and said buffer is an element that has a substantially constant delay amount regardless of the delay setting data.

3. The delay circuit as claimed in claim 2, wherein said first delay element has a first inverter that delays and inverts the input signal to output the delay signal, said second delay element has a second inverter that delays and inverts the delay signal to output the delay signal, and said buffer outputs the delay signal to said second delay element via two inverters connected serially.

4. The delay circuit as claimed in claim 3, wherein said first delay element further has a first current source that controls a power source current through the first inverter to control the delay amount of the first inverter, said second delay element further has a second current source that controls a power source current through the second inverter to control the delay amount of the second inverter, and the delay circuit further comprises a delay control block operable to control the power source current generated from the first current source and the second current source.

5. The delay circuit as claimed in claim 4, wherein said delay control block comprises: a voltage generating unit that generates a basic voltage according to a given delay setting data; and a voltage converting unit that converts the basic voltage into a control voltage and supplies the control voltage to the first current source and the second current source, according to the characteristics of the first current source and the second current source, in order to cause the first current source and the second current source to generate the power source current.

6. A delay circuit that delays an input signal to output the delayed signal, comprising:
   a first delay block operable to receive the input signal and delay the input signal to output the delayed signal;
   a second delay block operable to delay the delay signal output from said first delay block to output the delayed signal: and
   a second delay control block operable to control a delay amount of said second delay block,
   wherein said first delay block and said second delay block respectively comprises:

a first delay element that receives the input signal and delays the input signal to output the delayed signal;

a buffer that receives the delay signal output from the first delay element and corrects a dullness of a waveform of the delay signal generated from the first delay element to output the corrected signal; and a second delay element that receives the corrected signal output from the buffer and delays the corrected signal to output the delayed signal, said second delay control block comprises:

a flip-flop that divides a signal to be input into said first delay block to receive the divided signal and acquires a delay setting data to control the delay amount according to the signal to be input into said first delay block; and a delay controlling unit that controls the delay amount of said second delay block based on the delay setting data acquired by the flip-flop.

7. The delay circuit as claimed in claim 6, wherein the delay circuit further comprises a first delay control block operable to control a delay amount of said first delay block, and said first delay control block and said second delay control block control the delay amounts of said first delay block and said second delay block so that the delay amounts are substantially identical with each other.

8. The delay circuit as claimed in claim 7, wherein said first delay control block comprises: a flip-flop that acquires the delay setting data according to a given trigger signal; and a delay controlling unit that controls the delay amount of said first delay block based on the delay setting data acquired by the flip-flop, and the flip-flop of said second delay control block acquires the delay setting data output from the flip-flop of said first delay control block according to the signal to be input into said first delay block.

9. A test apparatus that tests a device under test, comprising:

a pattern generator operable to generate a test pattern testing the device under test;

a waveform shaper operable to shape a test signal to be supplied to the device under test based on the test pattern and supply the shaped signal to the device under test; and a timing generator operable to generate a timing signal controlling the timing in which said waveform shaper supplies the test signal to the device under test, said timing generator comprising:

a first delay element that receives a reference signal and delays the reference signal to output the delayed signal;

a buffer that receives the delay signal output from the first delay element and corrects a dullness of a waveform of the delay signal generated from the first delay element to output the corrected signal, so that a rising time of the corrected signal is substantially zero, wherein the rising time is duration that a voltage value of the rising edge of the delay signal takes to reach a predetermined threshold voltage; and a second delay element that receives the corrected signal output from the buffer and delays the corrected signal to output the timing signal.

* * * * *